US009012989B2

(12) United States Patent
Huang et al.

(10) Patent No.: US 9,012,989 B2
(45) Date of Patent: Apr. 21, 2015

(54) HIGH VOLTAGE DEVICE AND MANUFACTURING METHOD THEREOF

(71) Applicants: Tsung-Yi Huang, Hsinchu (TW); Chien-Hao Huang, Magong (TW)

(72) Inventors: Tsung-Yi Huang, Hsinchu (TW); Chien-Hao Huang, Magong (TW)

(73) Assignee: Richtek Technology Corporation, R.O.C., Chupei, Hsin-Chu (TW)

( * ) Notice: Subject to any disclaimer, the term of this patent is extended or adjusted under 35 U.S.C. 154(b) by 0 days.

(21) Appl. No.: 14/483,520

(22) Filed: Sep. 11, 2014

(65) Prior Publication Data

US 2015/0028417 A1    Jan. 29, 2015

Related U.S. Application Data

(62) Division of application No. 13/317,401, filed on Oct. 17, 2011, now Pat. No. 8,859,375.

(51) Int. Cl.
| | |
|---|---|
| *H01L 29/66* | (2006.01) |
| *H01L 29/78* | (2006.01) |
| *H01L 21/266* | (2006.01) |
| *H01L 29/06* | (2006.01) |
| *H01L 29/08* | (2006.01) |
| *H01L 29/10* | (2006.01) |
| *H01L 29/423* | (2006.01) |

(52) U.S. Cl.
CPC .......... *H01L 29/7816* (2013.01); *H01L 21/266* (2013.01); *H01L 29/0692* (2013.01); *H01L 29/0847* (2013.01); *H01L 29/42368* (2013.01); *H01L 29/66659* (2013.01); *H01L 29/7835* (2013.01); *H01L 29/0653* (2013.01); *H01L 29/086* (2013.01); *H01L 29/0878* (2013.01); *H01L 29/1095* (2013.01)

(58) Field of Classification Search
CPC ................... H01L 29/7835; H01L 29/66659; H01L 29/0847; H01L 29/7816; H01L 29/0634
USPC ........... 257/339, 341, 343, 492; 438/289, 400
See application file for complete search history.

(56) References Cited

U.S. PATENT DOCUMENTS

| | | | | |
|---|---|---|---|---|
| 6,297,534 | B1 * | 10/2001 | Kawaguchi et al. | 257/341 |
| 7,576,388 | B1 * | 8/2009 | Wilson et al. | 257/330 |
| 2001/0050394 | A1 * | 12/2001 | Onishi et al. | 257/343 |
| 2002/0167020 | A1 * | 11/2002 | Iwamoto et al. | 257/110 |
| 2003/0193067 | A1 * | 10/2003 | Kim et al. | 257/343 |
| 2004/0002196 | A1 * | 1/2004 | Lee et al. | 438/301 |
| 2013/0032922 | A1 * | 2/2013 | Kawahara et al. | 257/492 |

* cited by examiner

*Primary Examiner* — Zandra Smith
*Assistant Examiner* — John M Parker
(74) *Attorney, Agent, or Firm* — Tung & Associates

(57) ABSTRACT

The present invention discloses a high voltage device and a manufacturing method thereof. The high voltage device is formed in a first conductive type substrate, wherein the substrate includes isolation regions defining a device region. The high voltage device includes: a drift region, located in the device region, doped with second conductive type impurities; a gate in the device region and on the surface of the substrate; and a second conductive type source and drain in the device region, at different sides of the gate respectively. From top view, the concentration of the second conductive type impurities of the drift region is distributed substantially periodically along horizontal and vertical directions.

4 Claims, 5 Drawing Sheets

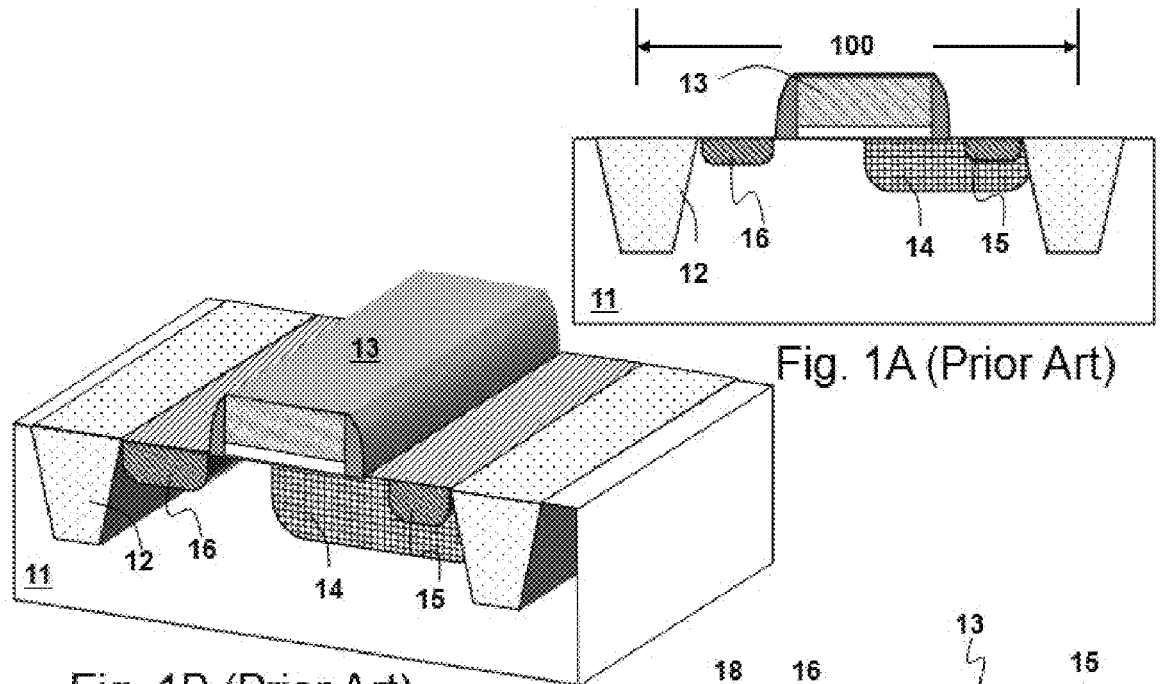
Fig. 1A (Prior Art)
Fig. 1B (Prior Art)
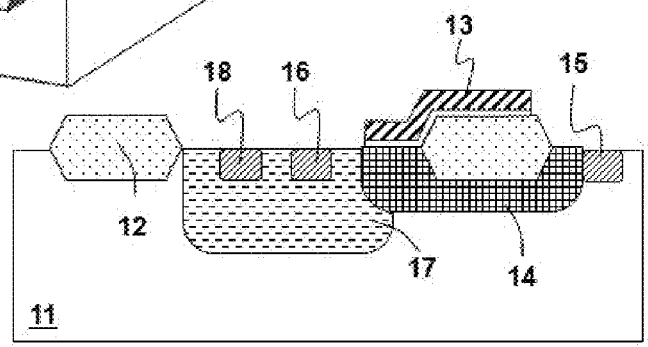
Fig. 2A (Prior Art)
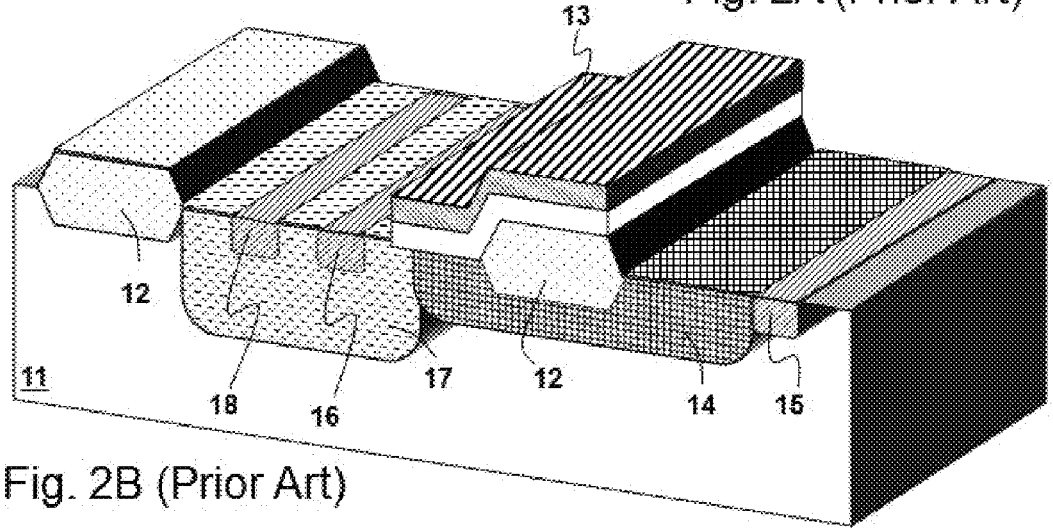
Fig. 2B (Prior Art)

HIGH VOLTAGE DEVICE AND MANUFACTURING METHOD THEREOF

This is a Divisional of a application Ser. No. 13/317,401, filed on Oct. 17, 2011.

CORRESPONDING REFERENCE

The present invention claims priority to TW 100108936, filed on Mar. 16, 2011.

BACKGROUND OF THE INVENTION

1. Field of Invention

The present invention relates to a high voltage device and a manufacturing method of a high voltage device; particularly, it relates to such device and manufacturing method wherein the breakdown voltage is increased.

2. Description of Related Art

FIGS. 1A and 1B show a cross-section view and a 3D (3-dimensional) view of a prior art double diffused drain metal oxide semiconductor (DDDMOS) device, respectively. As shown in FIGS. 1A and 1B, a P-type substrate 11 has multiple isolation regions 12 by which a device region 100 is defined. The isolation region 12 for example is a shallow trench isolation (STI) structure or a local oxidation of silicon (LOCOS) structure, the former being shown in the figures. The DDDMOS device is formed in the device region 100, which includes a gate 13, a drift region 14, a drain 15, and a source 16. The drift region 14, drain 15 and the source 16 are formed by a lithography process and an ion implantation process, wherein the lithography process defines the implantation regions by a photoresist mask together with a self-alignment effect provided by all or part of the gate 13 and the isolation regions 12, and the ion implantation implants N-type impurities to the defined regions in the form of accelerated ions. The drain 15 and the source 16 are beneath the gate 13 and at different sides thereof respectively. Part of the drift region 14 is located beneath the gate 13 near the drain. The DDDMOS device is a high voltage device designed for applications requiring higher operation voltages. However, if it is required for the DDDMOS device to be integrated with a low voltage device in one substrate, the high voltage device and the low voltage device should adopt the same manufacturing process steps with the same ion implantation parameters, and thus the flexibility of the ion implantation parameters for the DDDMOS device is limited; as a result, the DDDMOS device will have a lower breakdown voltage and therefore a limited application range. To increase the breakdown voltage of the DDDMOS device, additional manufacturing process steps are required, that is, an additional lithography process and an additional ion implantation process are required in order to provide different ion implantation parameters, but this increases the cost.

FIGS. 2A and 2B show a cross-section view and a 3D view of a prior art lateral diffused metal oxide semiconductor (LDMOS) device. Compared to the prior art shown in FIGS. 1A and 1B, the LDMOS device shown in FIGS. 2A and 2B has a body region 17 and a body electrode 18, and part of its gate 13 is located on the isolation region 12. Still similarly, when the LDMOS device is integrated with a low voltage device in one substrate, the high voltage device and the low voltage device should adopt the same manufacturing process steps with the same ion implantation parameters, and thus the flexibility of the ion implantation parameters for the LDMOS device is limited; as a result, the LDMOS device will have a lower breakdown voltage and therefore a limited application range. To increase the breakdown voltage of the LDMOS device, additional manufacturing process steps are required, that is, an additional lithography process and an additional ion implantation process are required in order to provide different ion implantation parameters, but this increases the cost.

In view of above, to overcome the drawbacks in the prior art, the present invention proposes a high voltage device and a manufacturing method thereof which provide a higher breakdown voltage so that the high voltage device may have a broader application range, in which additional manufacturing process steps are not required such that the high voltage device can be integrated with and a low voltage device and manufactured by common manufacturing process steps.

SUMMARY OF THE INVENTION

The first objective of the present invention is to provide a high voltage device.

The second objective of the present invention is to provide a manufacturing method of a high voltage device.

To achieve the objectives mentioned above, from one perspective, the present invention provides a high voltage device, which is formed in a first conductive type substrate, the substrate having a device region defined by at least one isolation region, the high voltage device including: a drift region, which is located in the device region and doped with second conductive type impurities, wherein from top view, a concentration of the second conductive type impurities of the drift region is distributed substantially periodically along horizontal and vertical directions; a gate, which is formed on a surface of the substrate; and a second conductive type source, and a second conductive type drain, which are formed at two sides of the gate in the device region respectively.

In one embodiment of the high voltage device, the drift region preferably includes a first drift region and a second drift region, which are between the source and the gate, and between the drain and the gate respectively.

In another preferable embodiment, the drift region is formed by process steps of lithography and ion implantation which also forma second conductive type well of another device in the substrate.

In another preferable embodiment, the concentration distribution of the second conductive type impurities of the drift region is in a form of a plurality of concentric circular loops each having closed or open corners.

From another perspective, the present invention provides a manufacturing method of a high device, including: providing a substrate having a first conductive type well and a device region defined by at least one isolation region; forming a drift region in the device region by doping second conductive type impurities, wherein from top view, a concentration of the second conductive type impurities of the drift region is distributed substantially periodically along horizontal and vertical directions; forming a gate in the device region on a surface of the substrate; and forming a second conductive type source and a second conductive type drain at two sides of the gate in the device region respectively, wherein the source and the drain are separated by the drift region.

In one embodiment of the manufacturing method, the step of forming the drift region preferably includes: defining a photoresist layer on the substrate by a photo mask, such that the photoresist layer has a substantially periodical pattern along the horizontal and vertical direction from top view; implanting the second conductive type impurities into the substrate; and thermally diffusing the second conductive type impurities to form the drift region.

In another embodiment of the manufacturing method, the photo mask preferably has a pattern including at least one circular loop.

The objectives, technical details, features, and effects of the present invention will be better understood with regard to the detailed description of the embodiments below.

BRIEF DESCRIPTION OF THE DRAWINGS

FIG. 1A shows a cross-section view of a conventional DDDMOS device.

FIG. 1B shows a 3D view of the conventional DDDMOS device.

FIG. 2A shows a cross-section view of a conventional LDMOS device.

FIG. 2B shows a 3D view of the conventional LDMOS device.

DESCRIPTION OF THE PREFERRED EMBODIMENTS

The drawings as referred to throughout the description of the present invention are for illustration only, to show the interrelations between the regions and the process steps, but not drawn according to actual scale.

Figure 3A:
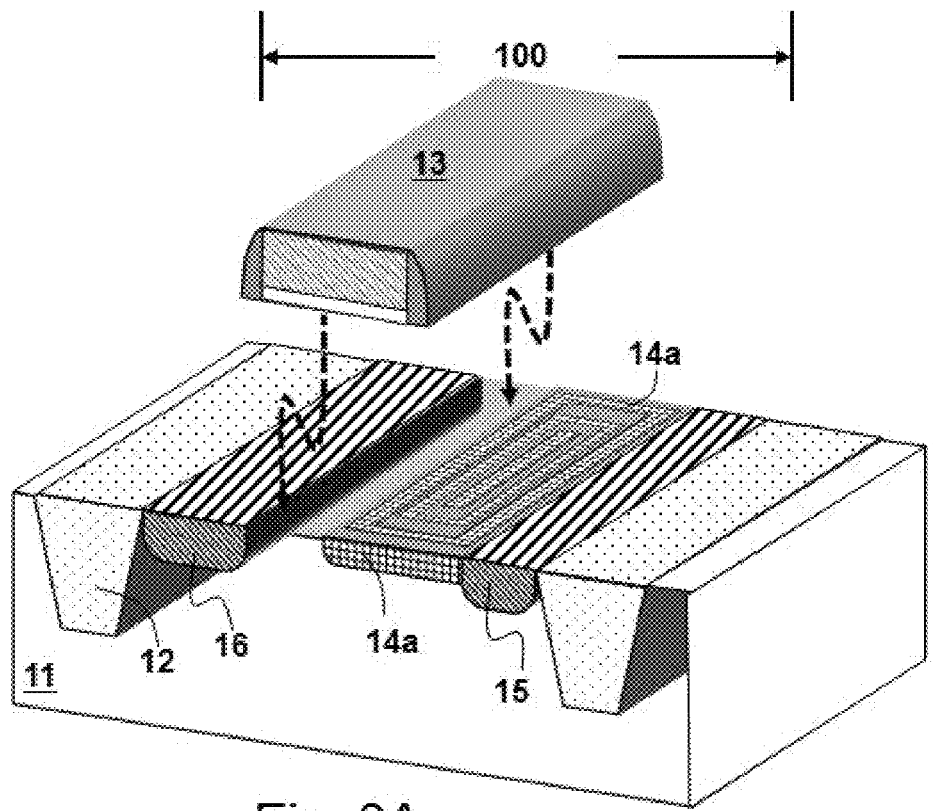
FIGS. 3A-3E show a first embodiment of the present invention.

Please refer to FIGS. 3A-3E for a first embodiment according to the present invention, wherein FIG. 3A shows a schematic 3D view of a DDDMOS device of the present invention. It should be noted that, in order to better illustrate the major feature of the present invention, the gate 13 and the substrate 11 are shown separately in FIG. 3A, but they should be in contact with each other in a practical device. As shown in FIG. 3A, in the substrate 11, isolation regions 12 are formed to define the device region 100, wherein the substrate 11 is, for example but not limited to, a P-type substrate (or an N-type substrate in another embodiment), and the isolation region 12 is, for example, an STI or a LOCOS structure (the former being shown in FIG. 3A). And as shown in FIG. 3A, a gate 13, drift region 14a, drain 15, and source 16 are formed in the device region 100, wherein the source 16 and drain 15 are, for example but not limited to N-type, and are formed at two sides of the gate 13 in the device region 100 respectively, separated by the gate 13 from top view (not shown). The drift region 14a is doped with second conductive type impurities, for example but not limited to N-type. This embodiment is different from the prior art in that, the concentration of the second conductive type impurities of the drift region 14a is distributed substantially periodically along the horizontal and vertical direction; in one embodiment as shown in the top view of FIG. 3B, the concentration distribution presents as multiple concentric rectangular loops. The grid-shaded regions in the figure indicate higher concentration regions of the second conductive type impurities, and the grey regions between the grid-shaded regions indicate lower concentration regions of the second conductive type impurities. This arrangement has the following advantages: First, in device specification, the present invention enhances the breakdown voltage of the DDDMOS device. Second, in manufacturing process, no additional mask or process steps are required if the DDDMOS device is manufactured in a wafer including other low voltage devices, as typically in a general case; in this case, the drift region 14a can be formed by the same lithography and implantation process steps for forming a second conductive type well of the low voltage device. Note that what is described is an NMOS device as an example; the high voltage DDDMOS device may be a PMOS device, and in this case the conductivities of the doped regions should be reversed, that is, the P-type regions should be replaced by N-type regions and the N-type regions should be replaced by P-type regions.

Figure 3B:
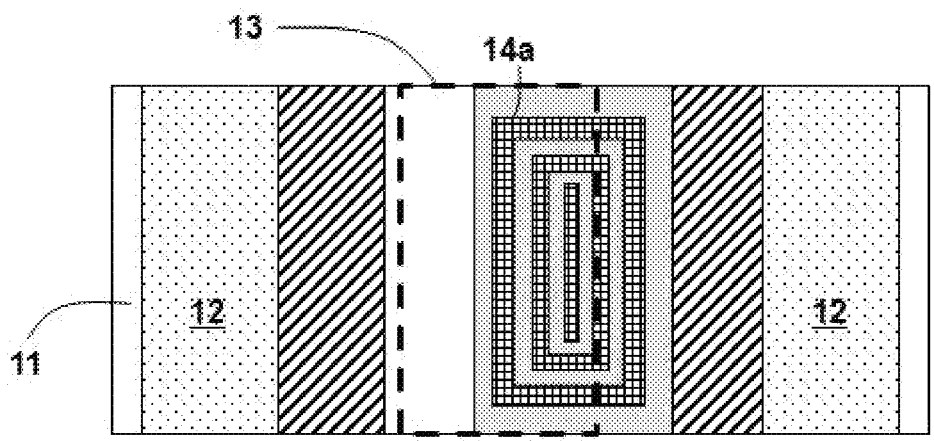
Figure 3C:
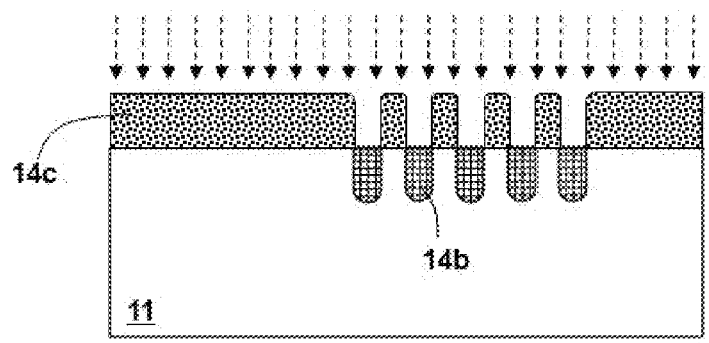
Figure 3D:
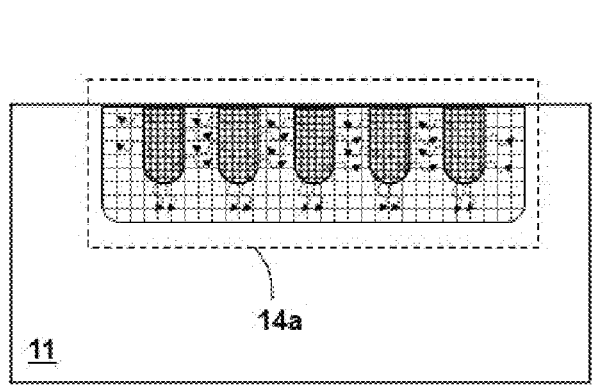
Figure 3E:
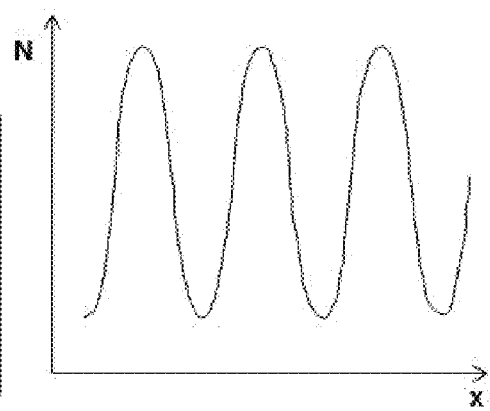

FIG. 3C shows a schematic cross-section view of steps for forming the drift region 14a of this embodiment. As shown in FIG. 3C, a photoresist layer 14c is formed on the substrate 11 and defined by a photo mask, such that the photoresist layer 14c has a substantially periodical pattern along the horizontal and vertical directions from top view, such as multiple concentric rectangular loops as shown in FIG. 3B. The second conductive type impurities are implanted into the open regions defined by the photoresist layer 14c in the substrate 11 in the form of accelerated ions, as indicated by the dashed arrow lines, such that regions 14b of the second conductive type impurities are formed in the substrate 11 which have a periodical pattern of concentration distribution. After thermal process steps, the second conductive type impurities of the regions 14b thermally diffuse to form the drift region 14a as indicated by the dashed arrow lines shown in FIG. 3D. From top view, the photoresist layer 14c includes a concentric pattern having multiple donut-shaped rectangular loops, such that the concentration distribution of the second conductive type impurities of the drift region 14a is as shown in FIG. 3E, that is, substantially periodical along the horizontal and vertical directions (the horizontal axis x in FIG. 3E indicating the position, and the vertical axis N in FIG. 3E indicating the concentration of the impurities).

Figure 4A:
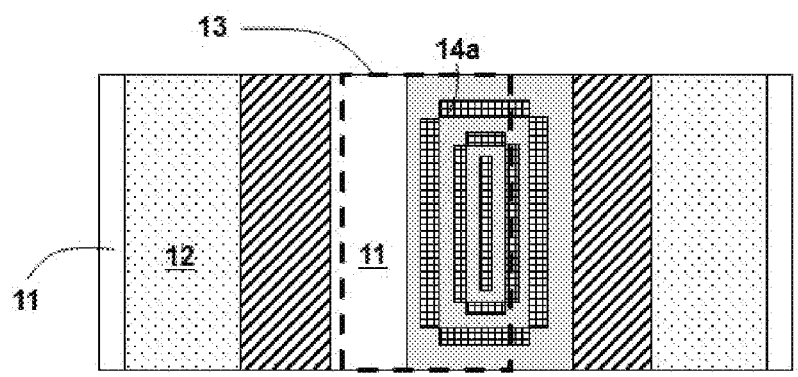
FIGS. 4A, 4B and 4C show examples of concentration distributions of the second conductive type impurities of the drift region in the embodiments of the present invention.
Figure 4B:
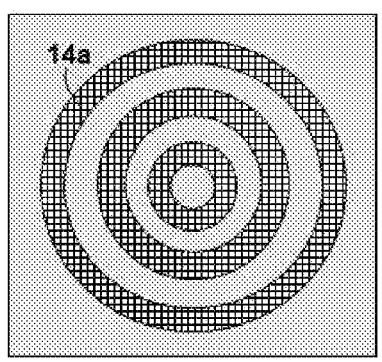
Figure 4C:
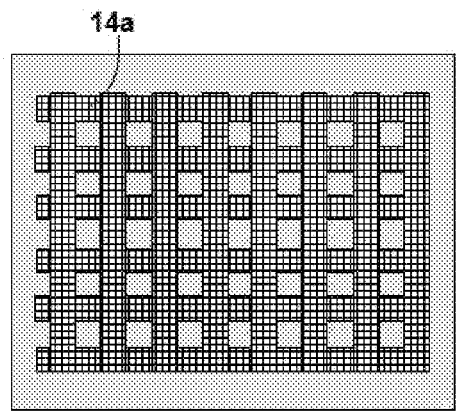

The concentration distribution of the second conductive type impurities of the drift region 14a is substantially periodical along the horizontal and vertical directions, but it is not limited to the form of multiple concentric rectangular loops as indicated in FIG. 3B. For example, the concentration distribution pattern of the drift region 14a may instead be a pattern as shown in FIG. 4A (wherein the circular loops have open corners, unlike FIG. 3B wherein the circular loops have closed corners), or multiple concentric circular loops as shown in FIG. 4B, or a matrix pattern as shown in FIG. 4C, etc. In summary, the concentration distribution may be arranged in any pattern as long as the concentration of the second conductive type impurities is distributed substantially periodically along the horizontal and vertical directions.

Figure 5A:
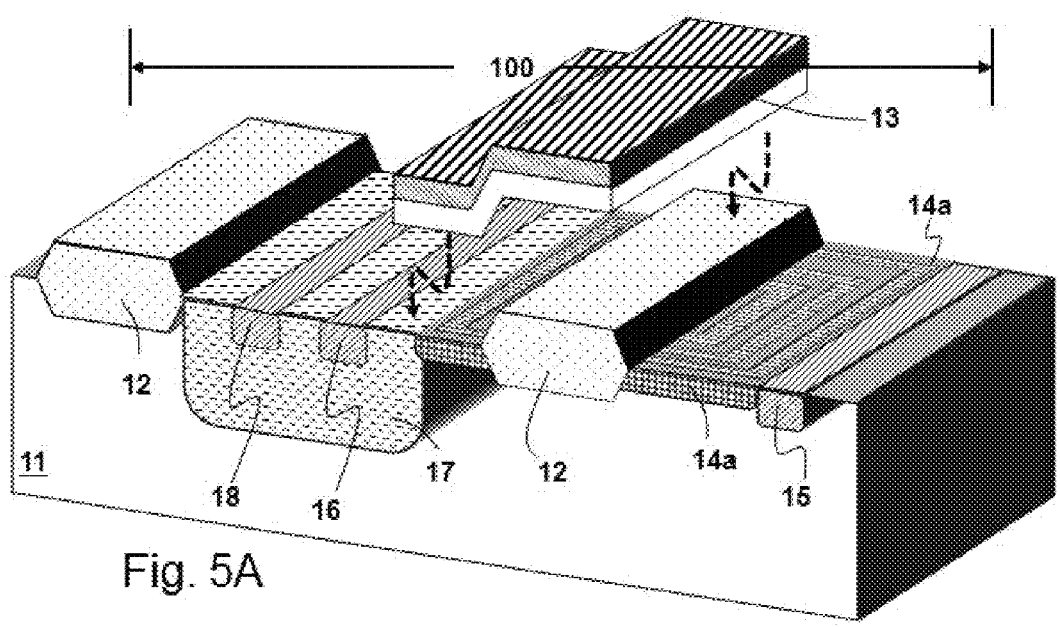
FIGS. 5A and 5B show another embodiment of the present invention.
Figure 5B:
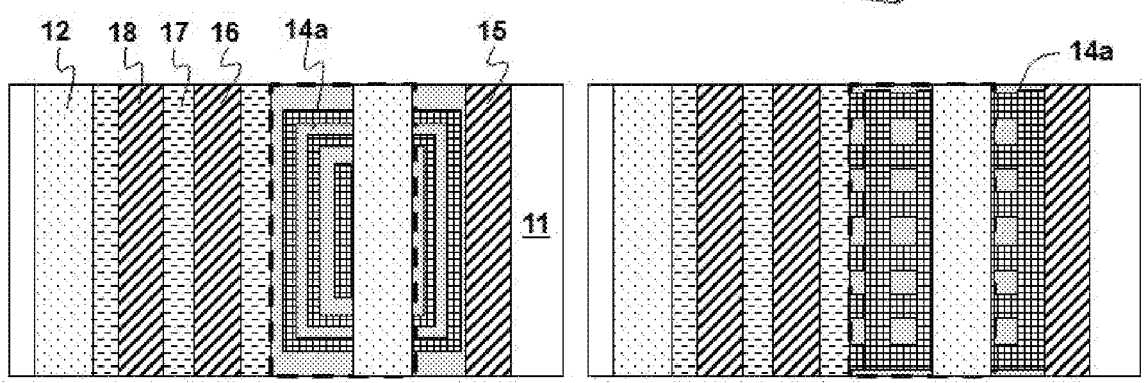

FIGS. 5A and 5B show another embodiment of the present invention. FIG. 5A shows a schematic 3D view of an LDMOS device of the present invention. It should be noted that, in order to better illustrate the major feature of the present invention, the gate 13 and the substrate 11 are shown separately in FIG. 5A, but they should be in contact with each other in a practical device. As shown in FIG. 5A, in the substrate 11, isolation regions 12 are formed to define the device region 100, wherein the substrate 11 is, for example but not limited to, a P-type substrate (or an N-type substrate in another embodiment), and the isolation region 12 is, for example, an STI or a LOCOS structure (the latter being shown in FIG. 5A). And as shown in FIG. 5A, a gate 13, drift region 14a, drain 15, source 16, body region 17, and body electrode 18 are formed in the device region 100, wherein the source 16 and drain 15 are, for example but not limited to N-type, and are formed at two sides of the gate 13 in the device region 100 respectively, separated by the gate 13 from top view (not shown). The body region 17 and the body electrode 18 are, for example but not limited to P-type. The drift region 14a is doped with second conductive type impurities, for example but not limited to N-type. This embodiment is different from the prior art in that, the concentration of the second conductive type impurities of the drift region 14a is distributed substantially periodically along the horizontal and vertical directions; in one embodiment as shown in the top view of FIG. 5B, the concentration distribution presents as multiple concentric rectangular loops. The grid-shaded regions in the figure indicate higher concentration regions of the second conductive type impurities, and the grey regions between the grid regions indicate lower concentration regions of the second conductive type impurities. This arrangement has the following advantages: First, in device specification, the present invention enhances the breakdown voltage of the LDMOS device. Second, in manufacturing process, no additional mask or process steps are required if the LDMOS device is manufactured in a wafer including other low voltage devices, as typically in a general case; in this case, the drift region 14a can be formed by the same lithography and implantation process steps for forming a second conductive type well of the low voltage device. Note that what is described is an NMOS device as an example; the high voltage LDMOS device may be a PMOS device, and in this case the conductivities of the doped regions should be reversed, that is, the P-type regions should be replaced by N-type regions and the N-type regions should be replaced by P-type regions.

Figure 5C:
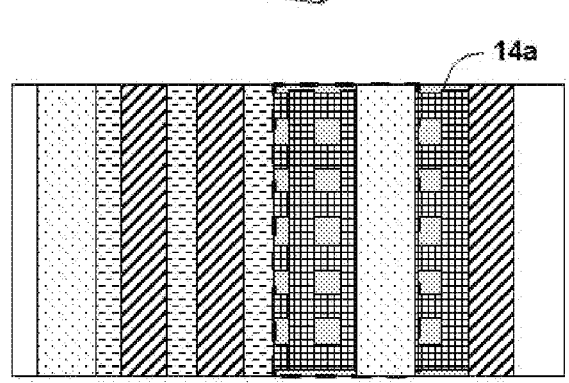
FIG. 5C shows an example of the concentration distribution of the second conductive type impurities of the drift region in the embodiment of the present invention.

The concentration distribution of the second conductive type impurities of the drift region 14a is substantially periodical along the horizontal and vertical directions, but it is not limited to the form of multiple concentric rectangular loops as indicated in FIG. 5B. For example, the concentration distribution pattern of the drift region 14a may instead be a matrix pattern as shown in FIG. 5C, etc. Certainly, the concentration distribution may be arranged in any other pattern as long as the concentration of the second conductive type impurities is distributed substantially periodically along the horizontal and vertical directions.

Figure 6A:
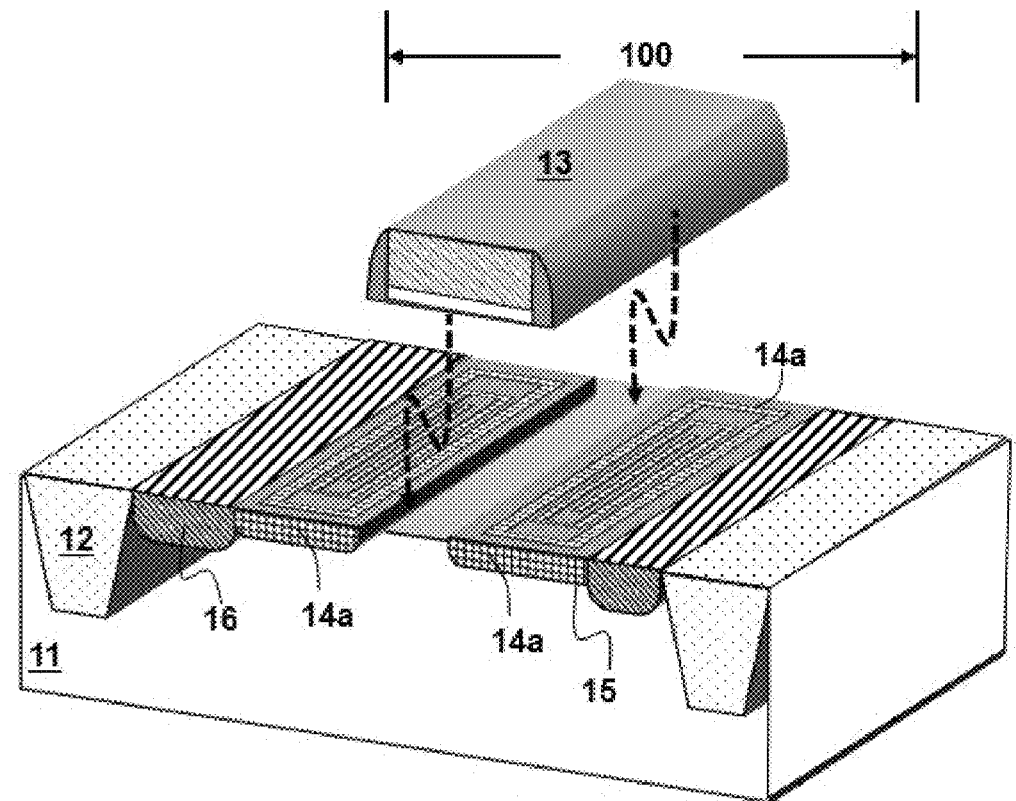
FIGS. 6A and 6B shows another embodiment of the present invention.
Figure 6B:
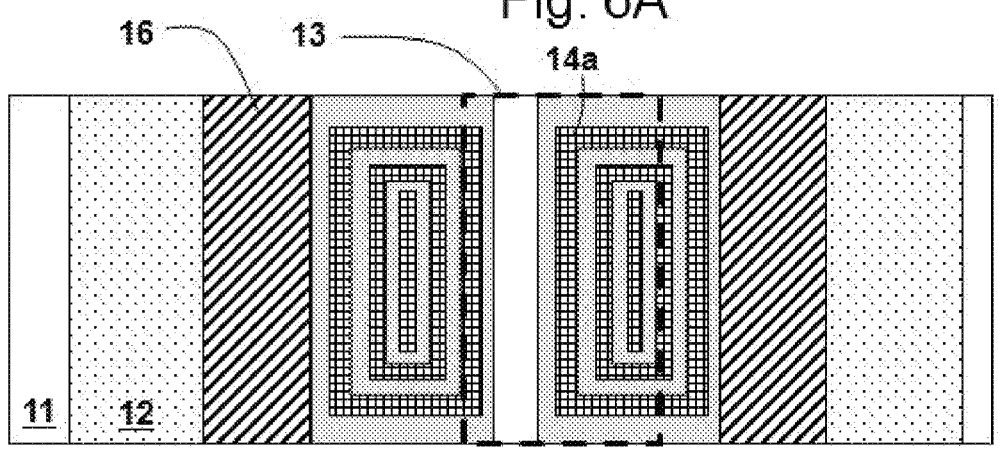

FIGS. 6A and 6B show another example of the present invention. FIG. 6A shows a schematic 3D view of a DDDMOS device of the present invention. This embodiment is different from the first embodiment in that, the DDDMOS device of this embodiment is a symmetrical high voltage device. As shown in FIGS. 6A and 6B, the drift region 14a includes two drift regions 14a, which are formed between the source 16 and the gate 13, and between the drain 15 and the gate 13 respectively, and from top view, both drift regions 14a have concentration distributions of the second conductive type impurities which are substantially periodical along the horizontal and vertical directions. The two drift regions 14a for example are formed by the same lithography process and the same ion implantation process.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a deep well, etc., can be added. For another example, the lithography step described in the above can be replaced by electron beam lithography, X-ray lithography, etc. For yet another example, that the concentration distribution is substantially periodical, should not be interpreted as an exact periodical repeat of peaks and valleys at the same levels and at fixed intervals; instead, there may be deviations. For another example, the pattern of the loops is not limited to rectangular and circular, and it may for example be hexagonal or octagonal, etc. In view of the foregoing, the spirit of the present invention should cover all such and other modifications and variations, which should be interpreted to fall within the scope of the following claims and their equivalents.

What is claimed is:

1. A high voltage device, which is formed in a first conductive type substrate, the substrate having a device region defined by at least one isolation region, the high voltage device comprising:
    a drift region, which is located in the device region and doped with second conductive type impurities, wherein from top view, a concentration of the second conductive type impurities of the drift region is distributed in a pattern of a plurality of concentric loops and substantially periodically along horizontal and vertical directions, wherein the concentric loops includes a plurality of first loops doped with a relatively lower concentration of the second conductive type impurities and a plurality of second loops doped with a relatively higher concentration of the second conductive type impurities, wherein the first loops and the second loops are arranged in an alternating order;
    a gate, which is formed on a surface of the substrate; and
    a second conductive type source, and a second conductive type drain, which are formed at two sides of the gate in the device region respectively.

2. The high voltage device of claim 1, wherein the drift region includes a first drift region and a second drift region, which are between the source and the gate, and between the drain and the gate respectively.

3. The high voltage device of claim 1, wherein the drift region is formed by process steps of lithography and ion implantation which also form a second conductive type well of another device in the substrate.

4. The high voltage device of claim 1, wherein the concentration distribution of the second conductive type impurities of the drift region is in a form of a plurality of concentric circular loops each having closed or open corners.

* * * * *